US012716954B2

(12) United States Patent
Strommenger et al.

(10) Patent No.: US 12,716,954 B2
(45) Date of Patent: Aug. 25, 2026

(54) BATTERY INTERNAL RESISTANCE ESTIMATION BY CHARGE CURRENT PULSE MODULATION

(71) Applicant: Microvast, Inc., Stafford, TX (US)

(72) Inventors: Daniel Strommenger, Ludwigsfelde (DE); Ying Huang, Ludwigsfelde (DE); Dariusz A. Zajac, Ludwigsfelde (DE); Yuanhang Wu, Ludwigsfelde (DE)

(73) Assignee: Microvast, Inc., Stafford, TX (US)

( * ) Notice: Subject to any disclaimer, the term of this patent is extended or adjusted under 35 U.S.C. 154(b) by 117 days.

(21) Appl. No.: 18/803,274

(22) Filed: Aug. 13, 2024

(65) Prior Publication Data

US 2026/0050044 A1 Feb. 19, 2026

(51) Int. Cl.
*G01R 31/389* (2019.01)
*G01R 31/3842* (2019.01)
*G01R 31/392* (2019.01)

(52) U.S. Cl.
CPC ....... *G01R 31/389* (2019.01); *G01R 31/3842* (2019.01)

(58) Field of Classification Search
CPC .. G01R 31/38; G01R 31/389; G01R 31/3842; G01R 31/392
See application file for complete search history.

(56) References Cited

U.S. PATENT DOCUMENTS

2022/0341999 A1* 10/2022 Konopka .............. H01M 10/48
2024/0222721 A1* 7/2024 Ghantous .............. H01M 10/44

FOREIGN PATENT DOCUMENTS

CN 113514772 A 10/2021

OTHER PUBLICATIONS

Seongjun Lee, et al., "Maximum pulse current estimation for high accuracy power capability prediction of a Li-Ion battery," Microelectronics Reliability: An International Journal & World Abstracting Service, vol. 55, No. 3, Jan. 13, 2015, pp. 572-581.
Extended European Search Report received for co-pending EP Application No. 24204040.0, Applicant: Microvast, Inc., et al., Mailing date: Jun. 3, 2025, 10 pages.
Barai et al., "A study of the influence of measurement timescale on internal resistance characterization methodologies for lithium-ion cells," Scientific Reports published on Jan. 8, 2018, 13 pages.

* cited by examiner

*Primary Examiner* — Neel D Shah
(74) *Attorney, Agent, or Firm* — Perkins Coie LLP

(57) ABSTRACT

A method of measuring battery internal resistance during a charging process of a battery is provided in the present technology. The method includes applying a charge current to the battery through modulating a charge current limit, monitoring battery operation conditions comprising a state of charge (SOC) of the battery and a temperature of the battery, applying a first current pulse by adjusting a charge current limit of the battery based on at least one of the battery operation conditions meeting one or more predefined threshold values, measuring voltages of the battery during a first and a second time window of the first current pulse, and estimating the battery internal resistance in accordance with variances of the voltages of the battery and variances of the charge current.

20 Claims, 12 Drawing Sheets

BATTERY INTERNAL RESISTANCE ESTIMATION BY CHARGE CURRENT PULSE MODULATION

TECHNICAL FIELD

The present disclosure relates to energy storage devices and, in particular, to energy storage device internal resistance estimation based on voltage variance resulting from a charge current pulse.

BACKGROUND

The understanding of an internal resistance of an energy storage device, such as a battery, plays an important role in ensuring the optimal functionality of a Battery Management System (BMS), particularly as the battery ages. This internal resistance estimation is important, not only for maintaining the operational integrity of the BMS but also for accurately predicting the state of health (SOH) of the energy storage device. For example, the SOH assessment can be essential for determining a battery's efficiency, capacity, and overall lifespan, thereby enabling more effective management and replacement strategies. The current state-of-the-art approach for estimating a battery's internal resistance in real-time via the BMS is known as the "direct resistance estimation" (DRE) method. This technique involves calculating the internal resistance based on the observed voltage drop that occurs when a current pulse is applied to the battery. Essentially, by introducing a known current pulse and measuring the resultant change in voltage, the DRE method allows for an immediate estimation of the internal resistance. This process has been integrated into the BMS to monitor and respond to changes in the battery's health condition, ensuring optimal performance and longevity.

However, application of the DRE method within an embedded BMS for energy storage device internal resistance estimation presents several challenges that can impact the method's effectiveness. First, there is a necessity for supplementary techniques to identify pulse events accurately, which can diminish the precision of the resistance estimation. To mitigate this issue, refined methods are needed to improve the accuracy of detecting pulse events. Secondly, the system must continuously record historical data at a high sampling rate to ensure that entire pulse events are captured by the BMS. This requires the BMS to possess additional processing power in handling extensive data storage and analysis. Additionally, the presence of uncontrolled current pulses can lead to inconsistent resistance values, making comparisons unreliable and affecting the overall performance of the BMS.

BRIEF DESCRIPTION OF THE DRAWINGS

The drawings illustrate only example embodiments and are therefore not to be considered limiting in scope. The elements and features shown in the drawings are not necessarily to scale, emphasis instead being placed upon clearly illustrating the principles of the example embodiments. Additionally, certain dimensions or placements may be exaggerated to help visually convey such principles. In the drawings, the same reference numerals used in different embodiments designate like or corresponding, but not necessarily identical, elements.

DETAILED DESCRIPTION

Figure 1:
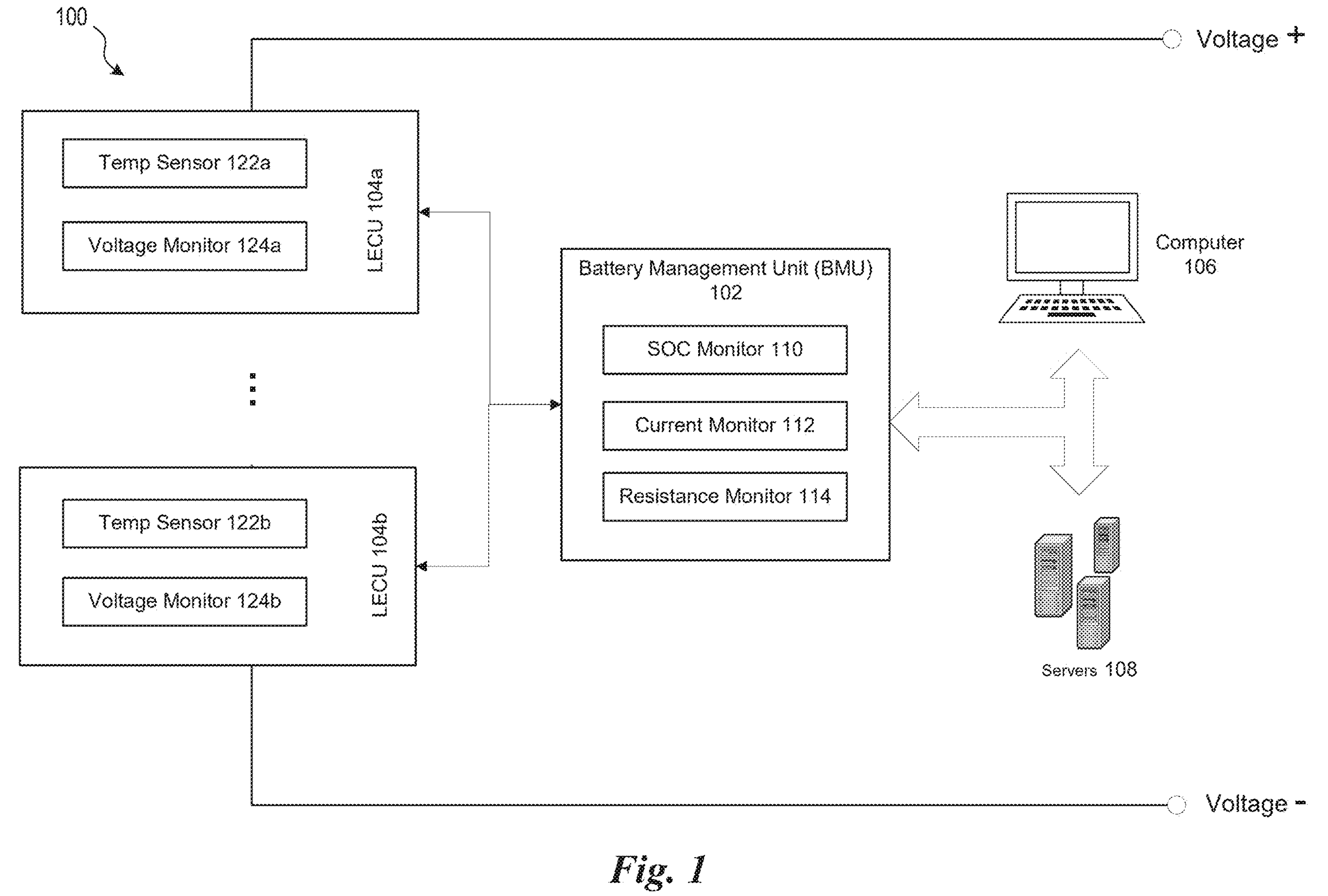
FIG. 1 shows a block diagram of a BMS for energy storage device internal resistance estimation configured in accordance with one or more embodiments of the present technology.

FIG. 1 shows a block diagram of a BMS 100 for energy storage device internal resistance estimation configured in accordance with one or more embodiments of the present technology. As illustrated, the BMS 100 includes a battery management unit (BMU) 102, one or more Local Energy Control Units (LECUs) 104*a* and 104*b* (referred to collectively as LECUs 104), a computer terminal 106, and one or more servers 108. In this example, each one of the LECUs 104 can be connected or coupled to a specific section of a battery pack in assisting the battery charging and/or discharging operations.

One key function of the BMS 100 is to charge and/or discharge connected batteries and precisely estimate the internal resistance of the batteries to ensure optimal functioning and longevity of battery systems for specific applications such as electric vehicles. LECUs 104 of the BMS 100 function as end devices situated within or coupled to each battery module. In this example, each LECU 104 is equipped with a temperature sensor 122 and a voltage monitor 124, ensuring comprehensive surveillance of the battery's operational parameters. These sensors and monitors embedded in corresponding LECUs are configured to feed real-time data back to the BMU 102, which processes this information to estimate the battery's internal resistance and other parameters.

The estimation of battery internal resistance by the BMU 102 is important for operation of a battery system. For example, it helps in ascertaining the battery's health and efficiency and facilitates the prediction of battery life expectancy. As shown in FIG. 1, the BMU 102 includes a SOC monitor 110 configured to monitor the SOC of the battery or battery cells under charging. Here, the BMU 102 guides the BMS 100 in making decisions regarding the battery's charge and discharge processes in order to optimize performance and prevent degradation. Additionally, the BMU 102 can be responsible for maintaining seamless communication with the electric vehicle's controller. In addition, the BMU 102 also includes a current monitor 112 and a resistance monitor 114. Here, the current monitor 112 is responsible for measuring the actual current that flows in and out of the battery pack. The resistance monitor 114, on the other hand, calculates the internal resistance of the battery cells based on measured current and voltage.

The BMS 100 is further enhanced by its integration with a computer terminal 106 and server(s) 108. The computer terminal 106 is a crucial interface to the BMS 100, allowing operators to interact with the BMS 100 and providing a user-friendly platform for monitoring the system's status, configuring settings, and initiating manual overrides if necessary. Moreover, the computer terminal 106 enables diagnostic functions and firmware updates for the components of the BMS 100, ensuring the system is equipped with the latest advancements in battery management technology and is operating with up-to-date calibration for accurate resistance estimation.

Server(s) 108 in the BMS 100 provide data storing and processing capabilities. For example, the server(s) 108 can store vast amounts of data collected from the LECUs 104*a* and 104*b*, which include historical and real-time performance metrics of the associated batteries. Specifically, the server(s) 108 can store the charge current and voltage information for internal resistance estimation of one or more specific batteries. The server(s) 108 can also utilize advanced algorithms to process collected data, contributing to functions such as predictive maintenance, wherein the system anticipates potential faults or degradation of the batteries before they become critical issues.

In this example, the BMS 100 integrates data collected from each of the LECUs 104 and processes the collected information to make high-level decisions for the battery or battery pack as a whole. For example, the BMS 100 can compile data received from all LECUs 104 to provide a comprehensive overview of the battery's status and make decisions on battery charging and discharging limits. In addition, the BMS 100 can perform battery cell balancing to ensure all the battery cells have equal charge levels. Further, the BMS 100 can utilize advanced algorithms and historical data stored in the servers 108 or in the BMU 102 to optimize the battery's performance, estimate its internal resistance, and increase its efficiency and extend its life. In this example, the BMS 100 can be integrated with a battery pack that is disposed or connected with an electronic vehicle (EV). Specifically, the BMS 100 can be coupled with an electric drive unit, information system, and external charging infrastructure.

As shown in FIG. 1, the BMS 100 can also include a battery resistance estimator 114 that is located in the BMU 102. The battery resistance estimator 114 can be configured to estimate a battery internal resistance in accordance with variances of voltage and variances of charge current of the battery. In addition, the BMS 100 can be connected to a power source. The power source can be configured to provide a constant charge current to the one or more LECUs for battery charging.

Figure 2:
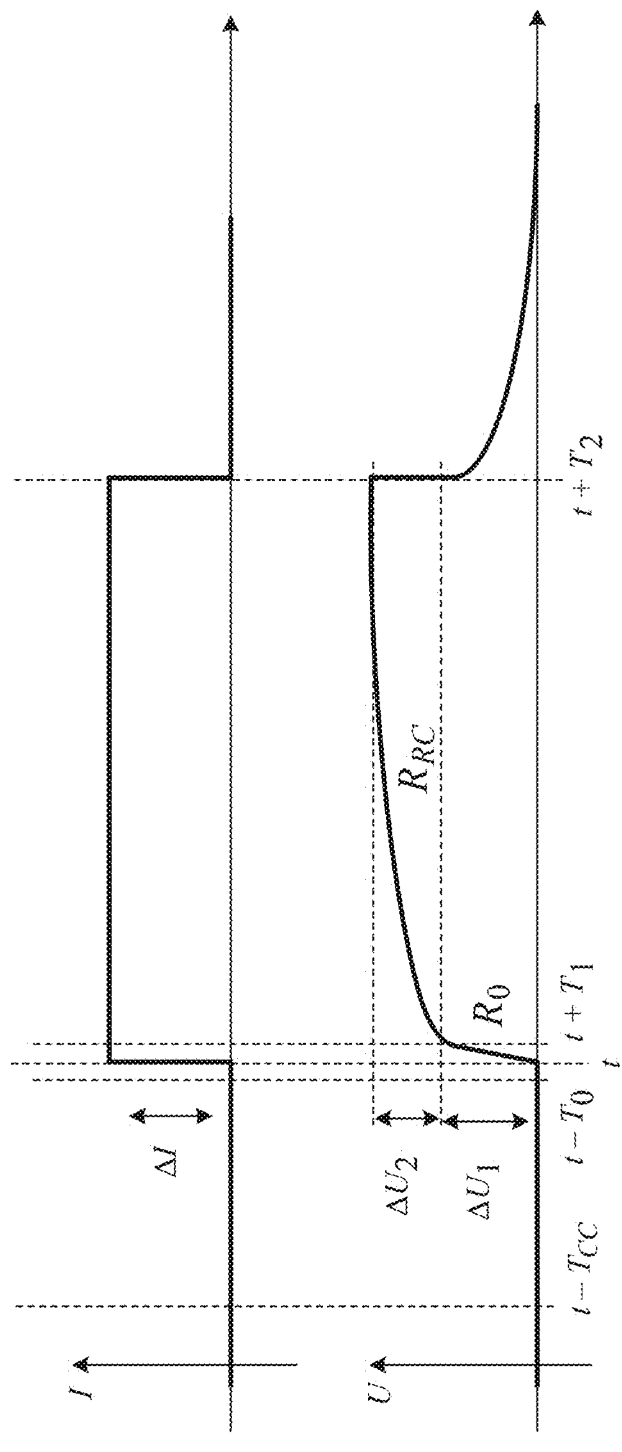
FIG. 2 shows voltage and current curves for estimating an internal resistance of an energy storage device using the DRE method.

FIG. 2 shows current and voltage curves of battery resistance estimation scheme using a pulsed current. This schematic in FIG. 2 represents a method of DRE employed in the BMS 100 for battery cell internal resistance estimation. This DRE method leverages the current pulse generated to trigger the resistance estimation process, through utilizing the relationship between the pulsed current and the resultant voltage within the battery cell.

As shown in FIG. 2, the battery internal resistance $R_{DC}$ is comprised of two distinct components: the pure ohmic impedance $R_0$, and the charge transfer impedance combined with concentration difference impedance (representing ionic diffusion within the solid phase) denoted as $R_{RC}$. These components collectively serve to approximate the electrochemical reactions occurring within the battery.

In this example, the current curve of FIG. 2 represents a step function where a current pulse is abruptly applied to the battery. This current pulse is immediately raised, after a certain period of $T_{CC}$ and at a specific time point of t, from zero to a specific amplitude within milliseconds, remaining constant for the duration of the pulse, and then sharply dropping back to zero. The rising edge and falling edge of the current curve are nearly vertical, indicating the rapid application and cessation of the current pulse. Concurrently recorded, the voltage curve of FIG. 2 exhibits the battery's instantaneous reaction to the applied current pulse. The voltage curve typically begins with a sudden voltage raise, $\Delta U_1$, which reflects the pure ohmic impedance $R_0$ of the battery cell, corresponding to the intrinsic resistive components such as the electrolyte, separator, and electrode conductivities in the battery. This instantaneous voltage change is due to the internal resistance the current encounters upon entering into the battery cell's electrochemical environment.

After the initial raise, the voltage continues to increase from $1+T_1$ at a slower rate, illustrating as $\Delta U_2$, which is indicative of charge transfer and concentration difference impedance $R_{RC}$. This gradual increase is attributed to the ionic diffusion within the solid phase of the electrode materials and the charge transfer at the electrode-electrolyte interface of the battery. The voltage curve eventually stabilizes into a plateau if the pulse is sustained, before recovering when the current is terminated at $1+T_2$.

In this example, the ohmic impedance $R_0$ is determined by the initial voltage drop $\Delta U_1$ per unit of current change $\Delta I$, while $R_{RC}$ is derived from the subsequent voltage drop $\Delta U_2$ per unit of current change. This process accounts for the charge transfer and concentration polarization effects within the battery. Specifically, the ohmic impedance $R_0$ and charge transfer and concentration difference impedance $R_{RC}$ can be estimated using below formulas:

$$R_0 = \Delta U_1 / \Delta I \text{ with:}$$

$$\Delta I = I(t + T_1) - I(t\text{-}T_0)$$

$$\Delta U_1 = U(t + T_1) - U(t\text{-}T_0)$$

$$R_{RC} = \Delta U_2 / \Delta I \text{ with:}$$

$$\Delta U_2 = U(t + T_2) - U(t + T_1)$$

Here, both of the $R_0$ and $R_{RC}$ are significantly influenced by the state of charge (SOC), temperature, and C-rate of corresponding battery under charging. Notably, the charge transfer and concentration difference impedance $R_{RC}$ also varies with the width of the current pulse applied, making it a dynamic variable in the resistance estimation process.

As described earlier in the background of the present disclosure, conventional DRE methods of estimating voltage rise resulting from a current pulse have many challenges. Such techniques require additional hardware and resources in detecting the current pulse and extra storage to store captured current pulse events. These conventional techniques are also challenging to provide repeatable current pulses in achieving comparable estimated battery resistance values. To overcome the drawbacks of such DRE methods, the present technology adopts modulation of replicable current pulses to allow accurate pulse resistance estimation without any need for current pulse detection or continuous storage of historic data. The disclosed current modulation method forces a current pulse by shortly adjusting a current limitation configured by the BMS 100. Since an EV or charger coupled with the BMS 100 must follow the current limitation, a current pulse will then be created. This current pulse can be directly used to trigger battery resistance estimation by monitoring corresponding current and voltage variances.

Figure 3:
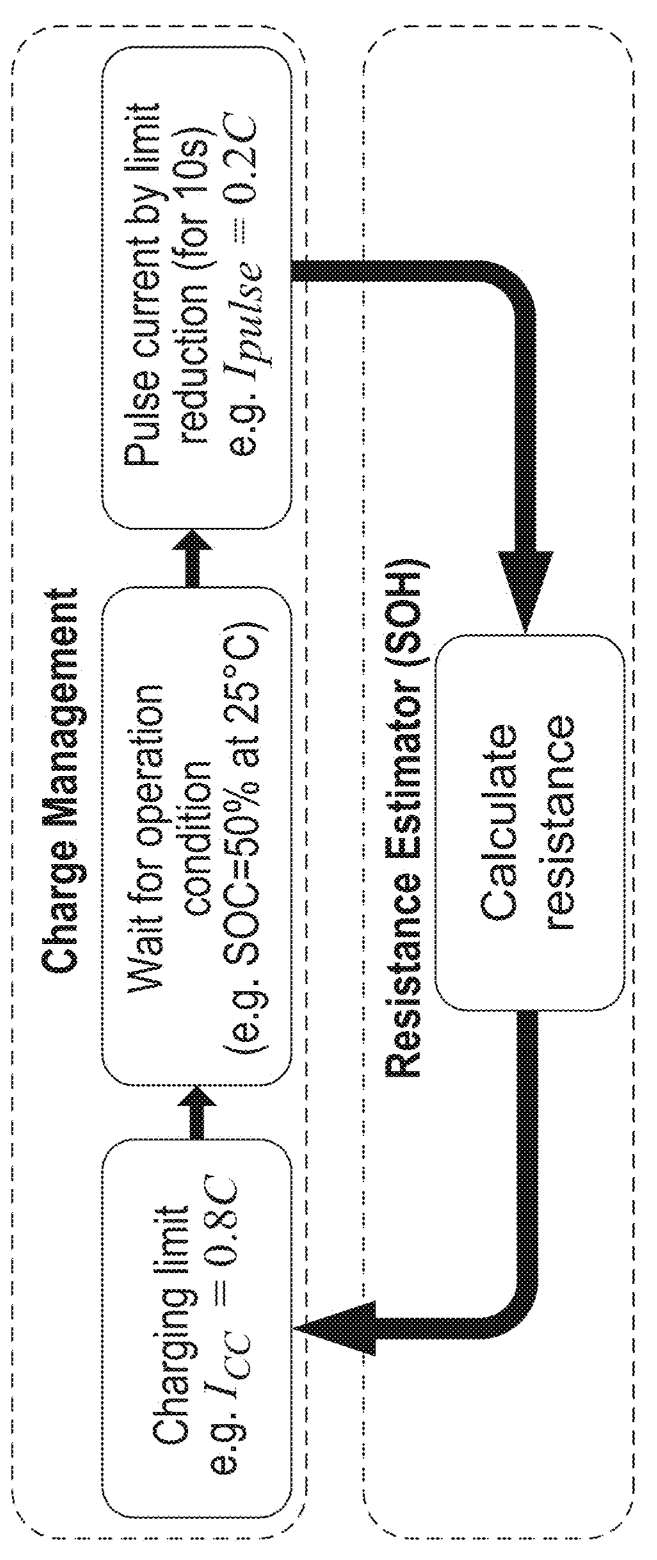
FIG. 3 illustrates a current modulation scheme for energy storage device internal resistance estimation in a Constant Current (CC) charging mode and configured in accordance with one or more embodiments of the present technology.

The present technology adopts a charge current limit modulation for battery charging in a CC phase. In this example, the battery charging can be in parallel to a working condition, e.g., during a vehicle operation. FIG. 3, for example, illustrates a current modulation scheme for energy storage device internal resistance estimation in the CC phase in accordance with one or more embodiments of the present technology. As shown, the current modulation scheme includes two phases: (1) the charge management phase; and (2) the resistance estimation phase. The charge management phase includes charge limit configuration, charging operation condition check, and execution of pulsed current by a current limit reduction. Here, the charge management phase can be performed by the BMS 100 in particularly the BMU 102 disclosed in FIG. 1. Moreover, the charge management operations can be performed sequentially. For example, a battery can be constantly charged by a charge current with a current amplitude close to or lower than a charge limit. In a following step, the current pulse can be applied to the battery under charging, if the battery operation conditions are satisfied. To estimate the battery resistance, e.g., under the resistance estimator scheme, the BMS 100 can collect current and voltage data from the battery and process it in the BMU 102, the computer terminal 106 and/or servers 108. The calculated battery resistance represents a SOH of the battery under charging.

When charging an energy storage device such as a battery, there is a maximum current level, e.g., the current limit, that should not be exceeded. Charging at a current limit is important to ensure that the battery's safety and longevity. In this example, the charge current limit can be configured in a certain range, e.g., between 0.5 C and 1 C. Specifically, the battery can be charged at a current limit, e.g., $I_{CC}$=0.8 C in a CC charging phase. Here, "C" represents a battery's capacity in ampere-hours (Ah). So, if a battery under charging has a capacity of 1 Ah (1000 mAh), charging it at 0.8 C would mean charging it at 0.8 A (800 mA). During the CC charging phase, the battery is being charged at a constant current, e.g., the charger supplies a steady current to the battery at the specified rate (e.g., $I_{CC}$=0.8 C) until the battery reaches a certain voltage level. After reaching this voltage, the charging can switch to a constant voltage (CV) phase to fully charge the battery while preventing overcharging.

The battery charge management, e.g., the BMS 100, can monitor operation conditions of the battery while charging, including the state of charge (SOC) of the battery and/or the temperature of the battery. To achieve a reproducible resistance estimation and prevent temperature and SOC impact, the current pulse should be triggered at a specific operation condition by waiting until the expected SOC and temperature range are reached (e.g., SOC=50% and 25° C.). In some other examples, one or more pre-defined threshold values comprise a SOC of the battery ranging from 50% to 80% and a battery temperature ranging from 10° C. to 40° C. which can be stored in the BMS 100 and adopted for the present technology. In further embodiments, other suitable threshold values may be utilized. Once the battery operation conditions meet the pre-defined values, the charge current limit will be reduced for a small-time span $T_{pulse}$ (e.g., 10 s) and by a small current amplitude (e.g., $I_{pulse}$=0.2 C), as illustrated in FIG. 3. In this example, the charging limit reduction led by the current pulse will create a significant voltage drop in the battery under charging. In some other examples, the charge limit can be increased, creating a significant voltage raise in the battery under charging.

Figure 4:
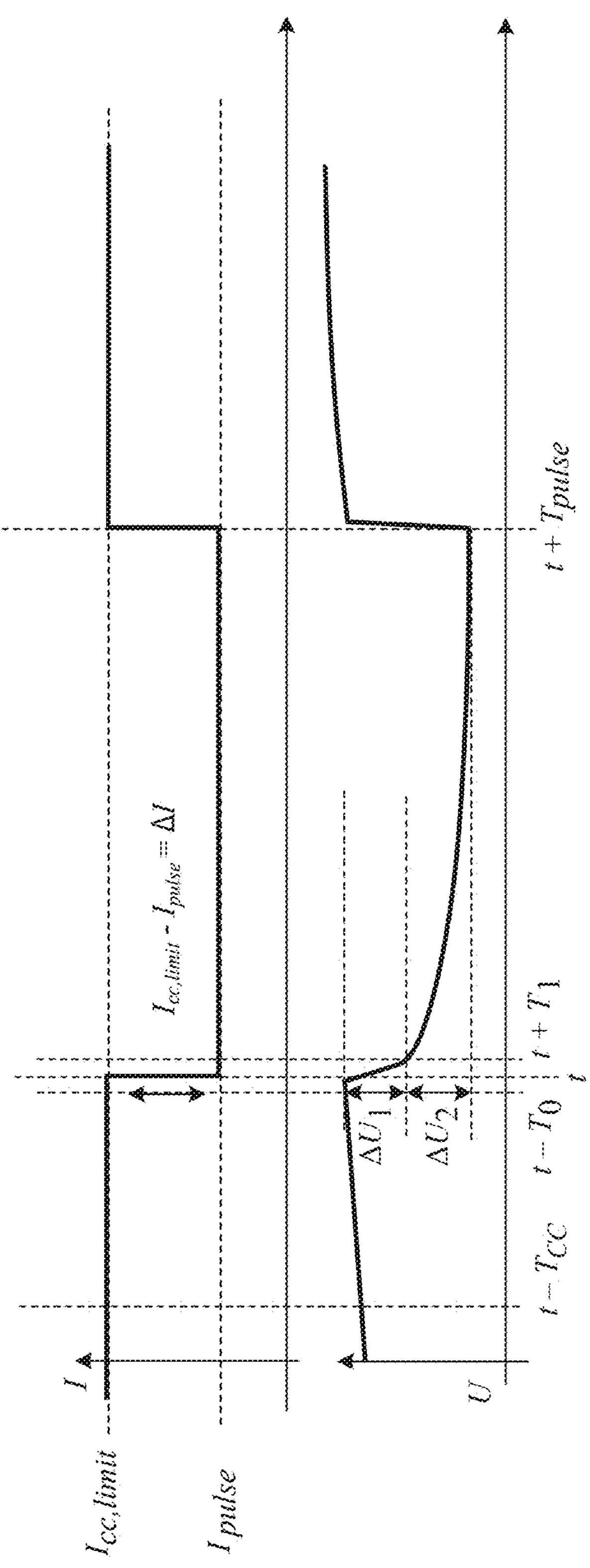
FIG. 4 shows voltage and current curves with modulated current pulse for energy storage device internal resistance estimation based on a falling edge of the current pulse in accordance with one or more embodiments of the present technology.

FIG. 4 shows voltage and current curves with modulated current pulse for energy storage device internal resistance estimation based on a falling edge of the current pulse in accordance with one or more embodiments of the present technology. In this example, the charge current $I_{CC}$ is set according to the current limit and shall be stable (e.g., variance less than +/−10% of the current) for a long span time $T_{CC}$ (e.g., 600 s). Here, the stabilized constant charge current can avoid overlayed voltage polarization and prevent wrong calculated resistance values. In addition, the ensured high polarization of the electrode surface of the battery under charging will have less impact on resulting voltage drop, which will lead to reproducible values of the estimated battery resistance. In this example, the applied charge current $I_{CC}$ can be constant and equal to or lower than the charge current limit.

Once the operation conditions of the battery meet the pre-defined values (e.g., SOC=50% and 25° C. described in FIG. 3), the current limit for battery charging is changed. As described above, a lower current limit that is pre-defined and stored in the BMS 100 can be applied on the charge current and trigger a negative current pulse to the battery under charging. In this example, the $I_{pulse}$ has a smaller current amplitude than the original current limit, e.g., $I_{pulse}$=0.2 C, and $I_{CC}$=0.8 C. In some other examples, the amplitude of the current pulse $I_{pulse}$ can be ranging between 10% to 90% of the charge current $I_{CC}$. Here, the lower $I_{pulse}$ leads to a falling edge of the charge current, noted as $\Delta I$. Accordingly, a voltage drop $\Delta U1$ corresponding to the reduction of charge current $\Delta I$ can be monitored. In the present technology, the charge current and current pulse can be direct current (DC) currents.

The current and voltage curves included in FIG. 4 illustrate a battery charging in a CC phase and battery internal resistance estimation using a falling edge of a pulse current. In this example, the modulated charge current, e.g., the current pulse $I_{pulse}$, only lasts for a small time span $T_{pulse}$. For example, the width of the current pulse $T_{pulse}$ can be about 10 s. During this period, the current pulse $I_{pulse}$ is constant (e.g., $I_{pulse}$=0.2 C) and the corresponding voltage keeps decreasing, noted as $\Delta U_2$ in FIG. 4. After $1+T_{pulse}$, the charge current is changed back to the original current limit. Here, the ohmic impedance $R_0$ and charge transfer and concentration difference impedance $R_{RC}$ can be estimated by $R_0=\Delta U_1/\Delta I$ and $R_{RC}=\Delta U_2/\Delta I$, respectively. In this example, the amplitude and width of the current pulse $I_{pulse}$ can be pre-defined and stored in the BMS 100 system, without acquiring additional memory storage nor additional operations on monitoring the current change. Addition, the current pulse $I_{pulse}$ can be automatically triggered once the operation conditions of the battery meet pre-defined criteria. This configuration simplifies the operation of the BMS 100 in estimating the battery resistance and does not significantly influence the vehicle performance.

Figure 5:
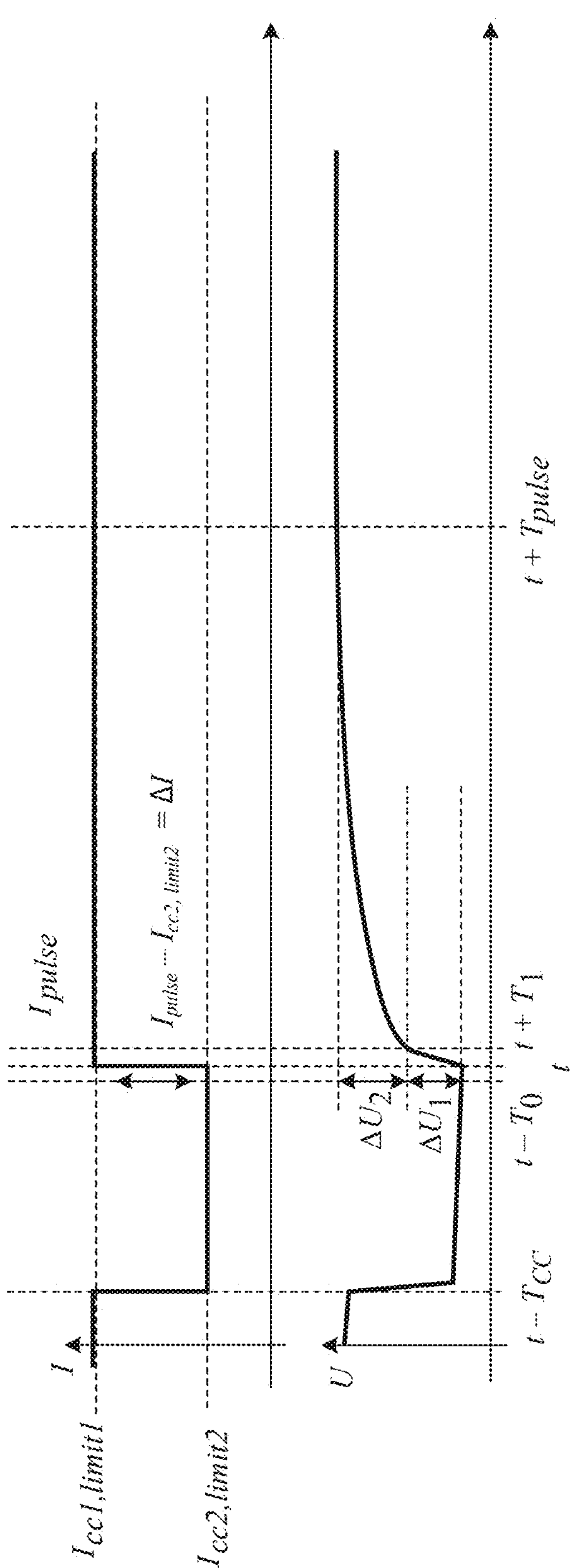
FIG. 5 shows voltage and current curves with modulated current pulse for energy storage device internal resistance estimation based on a raising edge of the current pulse in accordance with one or more embodiments of the present technology.

Alternatively, a battery resistance can be estimated utilizing a raising edge of a current pulse having a reduced current limit and during a CC charging phase. FIG. 5, for example, shows voltage and current curves with modulated current pulse for energy storage device internal resistance estimation based on a raising edge of a current pulse having decreased current limit, in accordance with one or more embodiments of the present technology. During the illustrated CC charging phase, it is possible to modulate the charging process by varying the current amplitude. Typically, batteries are charged at the highest possible current that the system can safely provide. This maximum current, e.g., current limit, is determined by the limitations of the charger's hardware, the vehicle's electrical system, or the battery's own performance capabilities. In this example, modulating the charge current involves temporarily increasing the amount of charge current flowing into the battery. Before increasing the charge current, it may be necessary to initially reduce the current limit. This preparatory step ensures that when the charge current is subsequently increased, it stays within the safe operational limits of the battery and charging system, e.g., BMS 100 descripted in FIG. 1.

In this example illustrated in FIG. 5, a current pulse having an intensity equal or higher than the previous configured current limit can be triggered. Before applying the equal or higher current limit, the previous configured current limit may be firstly reduced, otherwise the charging time of the battery will be lengthened. For example, when the SOC of the battery is equal to 50% and the battery temperature is 25° C., the current limit can be firstly reduced, e.g., from $t-T_{CC}$ to t, the $I_{CC1}$ under current limit 1 is reduced to $I_{CC2}$ under current limit 2. In this example, the time span $T_{CC}$ can range from 100 s to 1200 s and $I_{CC2}$ ranges from 10% to 90% of $I_{CC1}$. In a next step, the current limit can be increased to form a current pulse $I_{pulse}$ having an increased intensity, e.g., from 1 to $1+T_{pulse}$. In particular, at t, the charge current can be modulated, e.g., from $I_{CC}$ 2=0.5 C to $I_{pulse}$=1 C. The current pulse $I_{pulse}$ may last for a short time span $T_{pulse}$ close to 10 s. In some other examples, the time span $T_{pulse}$ can range from 10 s to 600 s. At $1+T_{pulse}$, the current limit is reset back to the previous value and the charge current is restored, e.g., $I_{CC}$=1 C. This causes a raising edge of the pulse current, at which the current variance $\Delta I$ and corresponding voltage variance $\Delta U_1$ and $\Delta U_2$ can be monitored, e.g., by the BMS 100. Here, the battery ohmic impedance $R_0$ can be estimated based on the monitored current and voltage characteristics including $\Delta U_1$ and $\Delta I$ from $t-T_0$ to $t+T_1$ at the raising edge of the current pulse $I_{pulse}$, and the voltage variance $\Delta U_2$ can be calculated from $t+T_1$ to $t+T_{pulse}$ at the raising edge of the current pulse $I_{pulse}$ for estimation of the battery charge transfer and concentration difference impedance $R_{RC}$. As shown in FIG. 5, the voltage curve will raise after t. The voltage variance can be continuously monitored until it varies less than a certain threshold (e.g., 1%), meaning the battery charging enters a constant voltage gradient phase at $1+T_{pulse}$.

In the present technology, the charge current limit modulation can be achieved by involving multiple constant currents (multi-CC) in the battery charging. For example, the current limit can be modulated for multiple times to various levels. Table I below describes two CC pulses that are used to for a fast battery charging. The goal here is to charge the battery as fast as possible to reach a high SOC value of the battery. In this example, two charge current pulses are applied to the battery in accordance with the battery voltage level. Particularly, the amplitude of a following current pulse can be ranging from 10% to 90% of the previous current pulse. For example, when the battery voltage is lower than a first voltage value, e.g., 4.15V, in a first CC charging phase, a first charge current $I_{CCI}$=0.8 C can be constantly applied. Once the battery voltage reaches 4.15V, the current limit will be reset to a lower value and form a first current pulse, e.g., $I_{pulse}$=10 A, for a certain time span, e.g., 10 s. After the period of the first current pulse $T_{pulseI}$, the current limit will be set to a smaller value compared to the first CC charging phase, e.g. $I_{CCII}$=0.4 C. In the following second CC charging phase, the battery voltage may be continuously increase. Once the battery voltage reaches a second voltage value, e.g., 4.18V, the charging process will be stopped. In other embodiments, the specific battery voltage values at which the multiple current pulses are triggered can vary.

TABLE I

Fast charging strategy for current modulation

| Step | Current limit |
|---|---|
| Charge until cell voltage >= 4.15 V | 0.8 C |
| pause for 10 s | 10 A |
| Charge until cell voltage >= 4.18 V | 0.4 C |

Figure 6:
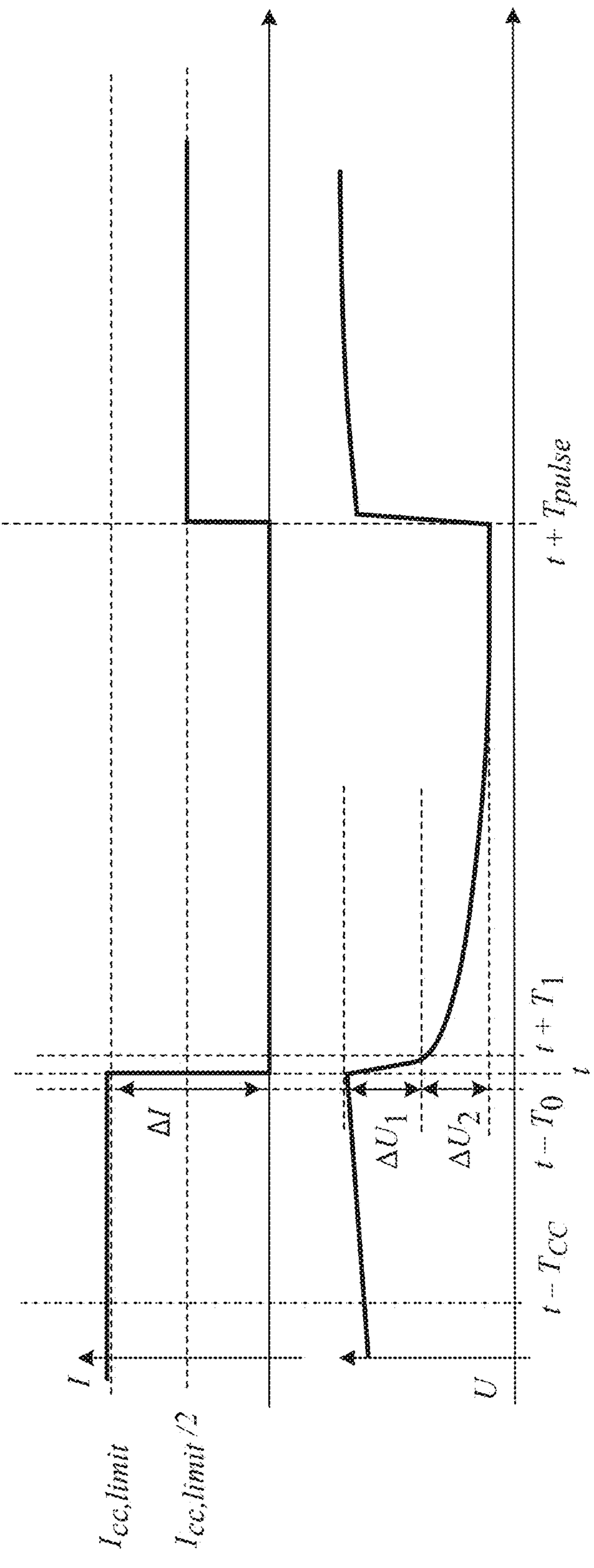
FIG. 6 shows voltage and current curves with modulated multiple current pulses for energy storage device internal resistance estimation based on a falling edge of one of the multiple current pulses in accordance with one or more embodiments of the present technology.

FIG. 6 shows voltage and current curves with modulated multiple current pulses for energy storage device internal resistance estimation based on a falling edge of one of the multiple current pulses in accordance with one or more embodiments of the present technology. In this particular example, the battery was charged at a current limit of 0.8 C. The first current pulse is triggered when the battery voltage reaches 4.15V. As shown in FIG. 6, the first current pulse leads to a current variance $\Delta I$, which in turn results a battery voltage reduction of $\Delta U_1$. In this multi-CC charging mode, the battery ohmic impedance $R_0$ can be estimated based on current and voltage characteristics collected between the time span from $t-T_0$ to $t+T_1$. Specifically, the battery ohmic impedance $R_0$ can be estimated as $R_0=\Delta U_1/\Delta I$. In addition, the battery voltage reduction from $t+T_1$ to $t+T_{pulse}$ can be monitored and collected as $\Delta U_2$. Here, the battery charge transfer and concentration difference impedance $R_{RC}$ can be estimated by $R_{RC}=\Delta U_2/\Delta I$. In some other examples, the battery internal resistance can be estimated based on current and voltage characteristics collected at the falling edge of the first current pulse and the time span after $t+T_{pulse}$.

In some other examples, additional current pulses can be incorporated to modulate the current limit and assist the battery resistance estimation. For example, a third current pulse having a current limit lower than the second current pulse can be applied following the second pulse current. Specifically, the third current pulse may have a current amplitude of 90% or less of the second pulse current. In theory, multi pulse currents can be applied to the current limit in present technology for battery resistance estimation, as long as they satisfy $I_{N+1}<I_N$, wherein N is the pulse index and $I_{N+1}/I_N$ ranges from 10% to 90%.

In the present technology, the battery SOC dependence to battery resistance estimation can be eliminated by modulating the current pulse to a fixed C-rate and at fixed battery voltage thresholds. Additionally, the present technology enables extending the $T_{pulse}$ time span, with which the battery resistance estimation based on the second current edge, e.g., the current raising edge of FIG. 5, becomes more reliable.

Another scheme of incorporating pulse currents for battery resistance estimation in the present technology is during the battery cell balancing. Battery cell balancing is a critical process in battery management, especially for battery packs composed of multiple cells, as can be found in EVs and various electronic devices. The main goal of cell balancing is to ensure that all the battery cells included in a battery pack maintain uniform charge levels, which maximizes the overall performance and lifespan of the battery.

During cell balancing, the DRE methods disclosed earlier can be employed in the present technology, although the voltage drop might be minimal due to the relatively low balancing current, such as 150 mA at 3.7V. Consequently, to accurately estimate the internal resistance during cell balancing, it is needed to have precise measurements of both current and voltage of the battery cell. If the BMS 100 can achieve such precision in current and voltage characteristics measurement, then current pulse modulation can be applied to battery cells that are not currently undergoing balancing. In this example, the battery cell balancing can be initiated for brief intervals (e.g., 10 s) to induce a slight modulation in cell current. This current modulation technique can be utilized for battery cells that are either under no load or subjected to a constant current. A significant benefit of this approach is its potential to enhance the accuracy of individual battery cell resistance estimations, providing a clearer insight into each battery cell's condition and optimizing the overall battery management strategy.

Figure 7:
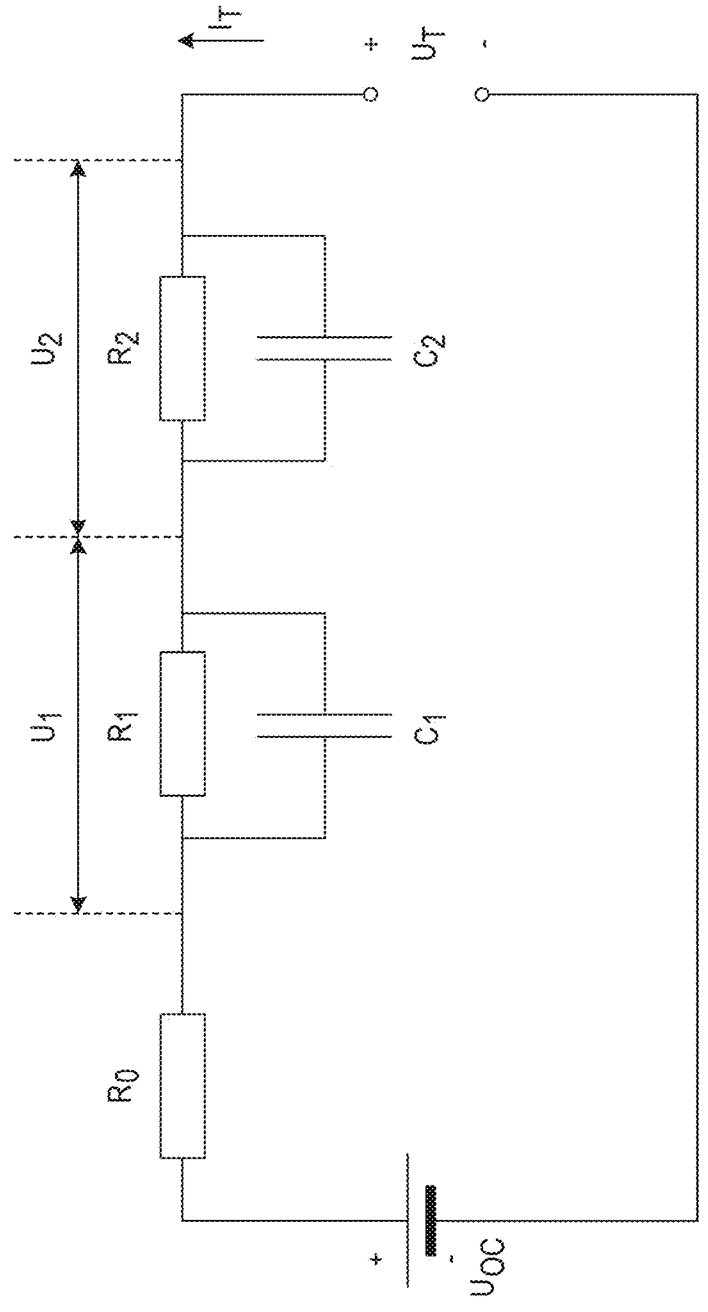
FIG. 7 shows an Equivalent Circuit Model (ECM) adopted in simulating energy storage device resistance and behaviors in accordance with one or more embodiments of the present technology.

In the present technology, a model-in-the-loop (MiL) simulation has been adopted in developing and testing of the battery resistance estimation strategies. Specifically, the MiL simulation involves the use of a software model to simulate the behavior of a battery pack and its management system within a virtual environment, such as MATLAB Simulink. A reduced-order battery model, such as a second-order equivalent circuit model (ECM) illustrated in FIG. 8, can be employed in these simulations to achieve a balance between simulation complexity and computational efficiency. In this second order ECM structure, additional elements are included to capture the battery's dynamic responses more accurately. For example, the ECM circuit of FIG. 7 includes a $U_{OC}$, which is an open-circuit voltage of the battery and is dependent on the SOC and temperature of the battery. In addition, the ECM circuit includes an ohmic resistance $R_0$, which represents an immediate voltage drop when a current pulse flows through the battery under charging or under discharging. Moreover, the ECM circuit includes two RC pairs $R_1C_1$ and $R_2C_2$, which capture the battery's dynamic behaviors. Specifically, each RC pair consists of a resistor (e.g., $R_1$, $R_2$) in series with a capacitor (e.g., $C_1$, $C_2$). In this example, the first RC pair ($R_1C_1$) might represent the fast-responding electrochemical processes, while the second RC pair ($R_2C_2$) captures other slower electrochemical processes. Here, the ECM circuit identified by Hybrid Pulse Power Characterization (HPPC) data can properly simulate voltage responses for current pulses applied to the battery.

Figure 8:
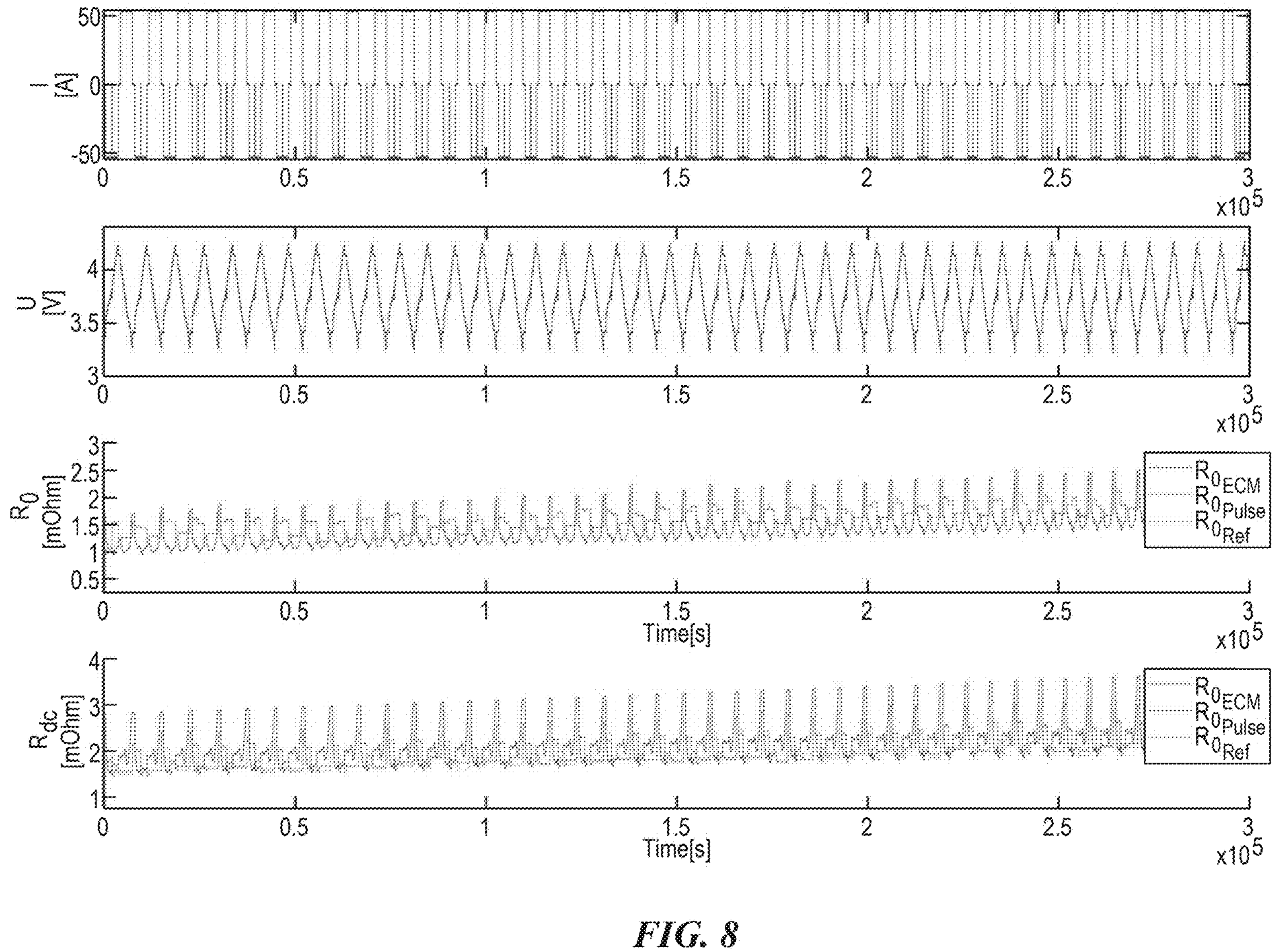
FIG. 8 shows an energy storage device accelerated aging simulation results generated in a Model-in-the-Loop (MiL) environment in accordance with one or more embodiments of the present technology.

FIG. 8 shows an energy storage device accelerated aging simulation results in a MiL environment in accordance with one or more embodiments of the present technology. The simulation results are generated by replicating the current pulses described above during a battery charging in a CC phase. In this example, the current pulse was modulated when a SOC of battery reaches 50% during the charging. Here, the ohmic impedance $R_0$ and the charge transfer and concentration difference impedance $R_{RC}$ curves are estimated based on corresponding current and voltage variances. The battery internal resistance results shown in FIG. 8 simulate battery aging during a period of 83.3 h. Further, the simulation results on the ohmic impedance $R_0$ and the charge transfer and concentration difference impedance $R_{RC}$ reveals that the battery resistance is increasing over time, indicating the battery aging. As a battery ages, various chemical and physical changes occur within it, leading to increased internal resistance.

Figure 9:
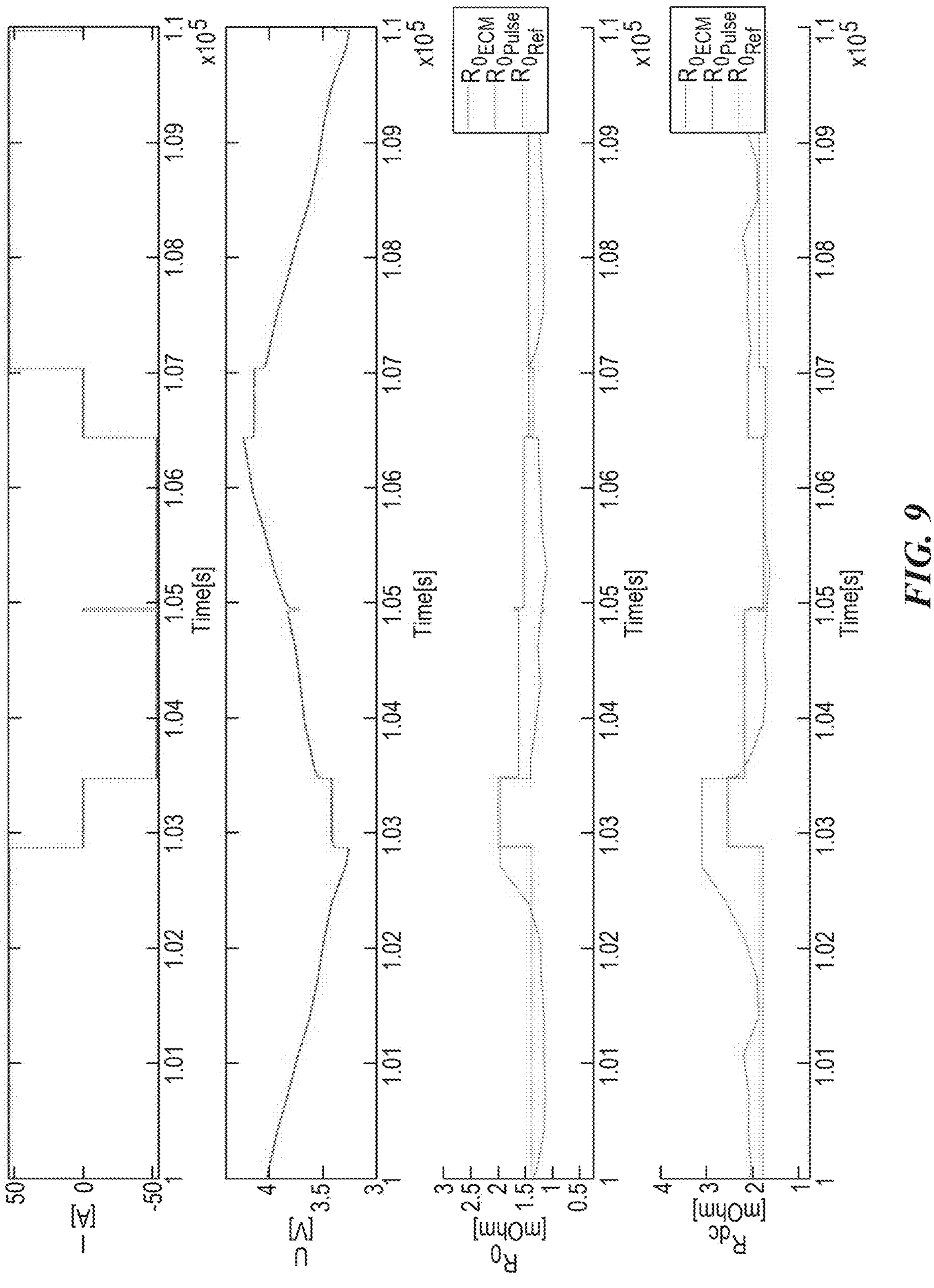
FIG. 9 shows a zoomed-in view of the energy storage device accelerated aging simulation results illustrated in FIG. 8.

FIG. 9 shows a zoomed-in view of the energy storage device accelerated aging simulation results illustrated in FIG. 8. The zoomed-in view only includes one and half cycles, e.g., a discharging phase of a first cycle, a charging phase of a second cycle, and a discharging phase of the second cycle. In this example, the modulation of the current pulse can be triggered when the SOC of the battery reaches 50%, during the charging phase.

Figure 10:
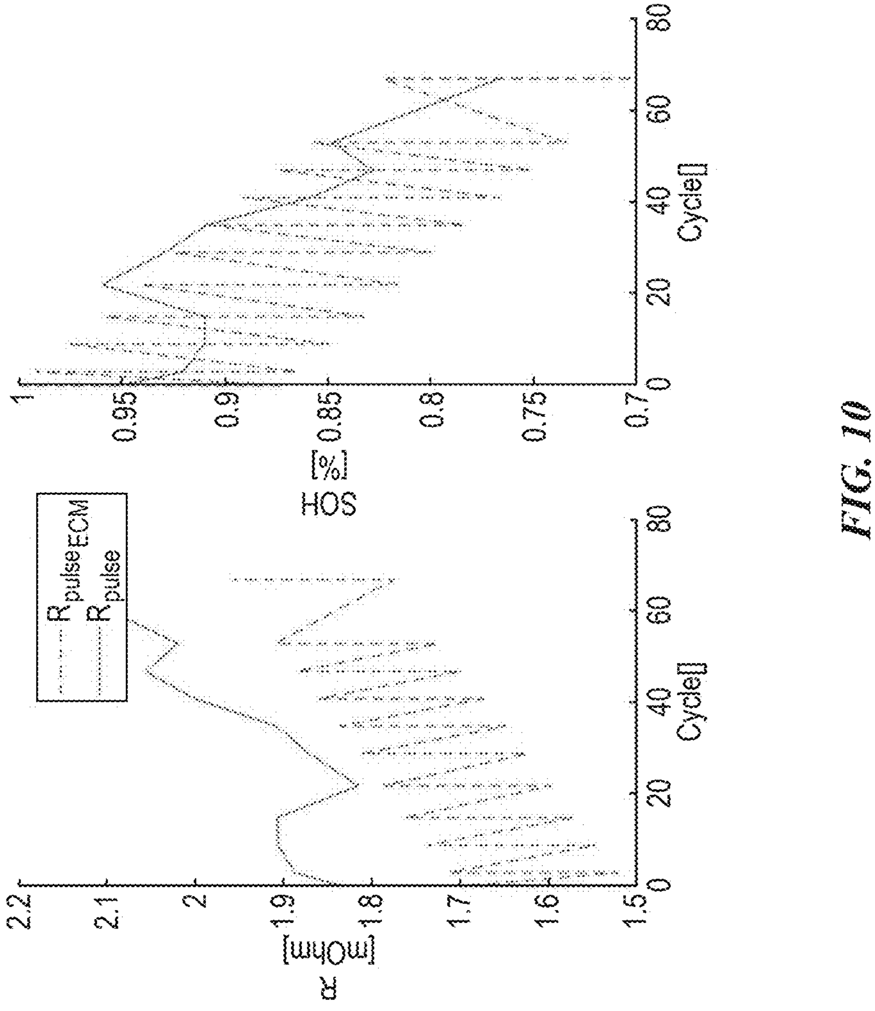
FIG. 10 shows energy storage device pulse resistance generated in the MiL simulation environment in accordance with one or more embodiments of the present technology.

In this work, the battery resistance estimated using DRE methods (e.g., pulsed current) is compared with the simulation results generated using the ECM circuit model. FIG. 10 shows the battery resistance and SOH, respectively, in accordance with one or more embodiments of the present technology. Particularly, the battery resistance and SOH of the battery shown in solid lines represent the estimated value using DRE methods. In comparison, the battery resistance and SOH of the battery shown in dash lines represent the simulation results. The root mean square error (RMSE) of the estimated battery resistance (R in solid line) is around 0.3 mOhm, indicating a good battery resistance estimation accuracy. Referring again to FIG. 8, the battery resistance curves and battery SOH curves are all normalized, showing that the estimated battery resistance and SOH of the battery respectively matches to the simulated battery resistance and SOH of the battery. This confirms that the MiL validation using ECM circuit model can accurately simulate the battery internal resistance estimation using pulse current, and other battery parameters such as the SOH of the battery. It is also recommended to validate the battery resistance estimation using a long-term test data and in a prototype EV.

Figure 11:
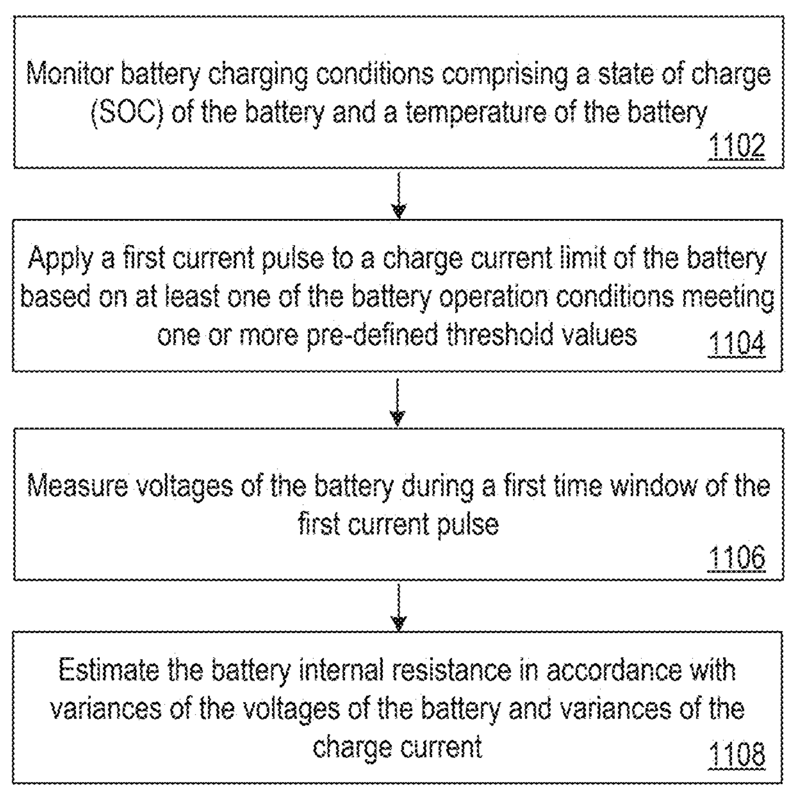
FIG. 11 is a flow chart illustrating a method of estimating internal resistance of an energy storage device in accordance with one or more embodiments of the present technology.

FIG. 11 is a flow chart illustrating a method 1100 of estimating internal resistance of an energy storage device in accordance with one or more embodiments of the present technology. Beginning at block 1102, the method 1100 includes monitoring battery operation conditions comprising a SOC of the battery and a temperature of the battery. For example, referring to FIGS. 1 and 12 together, the BMS 100 can monitor the operation conditions of battery or battery packs through LECUs 104 coupled thereon and the BMU 102 connected to the LECUs 104.

At block 1104, the method 1100 includes applying a first current pulse to a charge current limit of the battery based on at least one of the battery operation conditions meeting one or more pre-defined threshold values. For example, referring to FIGS. 4 and 12 together, once a SOC of a battery reaches 50% and the battery temperature reaches 25° C., the current pulse having a lower current limit, e.g., $I_{pulse}$=0.2 C, can be applied on the battery.

At block 1106, the method 1100 further includes measuring voltages of the battery during a first time window of the first current pulse. For example, referring to FIGS. 4 and 12 together, battery voltage variances can be measured during the falling edge region of the current pulse and/or the width of the current pulse $T_{pulse}$, which can be about 10 s.

Finally, at block 1108, the method 1100 includes estimating the battery internal resistance in accordance with variances of the voltages of the battery and variances of the charge current. For example, referring to FIGS. 4 and 12 together, the battery internal resistance including the ohmic impedance $R_0$ and charge transfer and concentration difference impedance $R_{RC}$ can be estimated by $R_0=\Delta U_1/\Delta I$ and $R_{RC}=\Delta U_2/\Delta I$.

Figure 12:
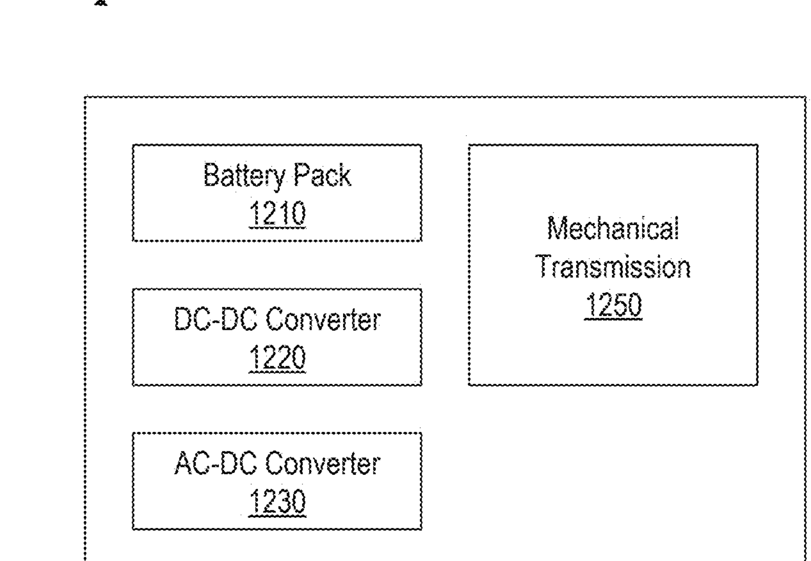
FIG. 12 is a schematic view of a system including an energy storage device configured in accordance with one or more embodiments of the present technology.

Any one of the energy storage devices and methods of estimating internal resistance of the energy storage devices described herein can be incorporated into any of a myriad of larger and/or more complex systems. FIG. 12, for example, is a representative example of such a system 1200. The system 1200 can include a battery pack 1210, a DC-DC converter 1220, an AC-DC converter 1230, a motor 1240, and/or other mechanical transmission 1250. The battery pack 1210 can include or coupled with a BMS 100, and features generally similar to those of the ionically and electronically conductive solid state electrolyte materials. The system 1200 can perform any of a wide variety of functions, such as energy storage and power delivery, that requires high energy density and rechargeability. In addition, the battery pack 1210 of the system 1200 can be configured in series or parallel arrangements to achieve a desired voltage and capacity requirements for specific applications. The DC-DC converter 1220 can be coupled with the battery pack 1210 and configured for voltage level conversion for specific voltage outputs and voltage stabilization. In addition, the AC-DC converter 1230 can be also coupled with the battery pack 1210, and configured to convert alternating current from a main power source into direct current to charge the battery pack 1210. In the system 1200, the battery pack 1210, serving as a power source, can be coupled to a motor 1240 or any other mechanical transmission 1250 to deliver electrical energy in the forms of current. The components of the system 1200 can also include remote devices and any of a wide variety of computer-readable media and controlling processors.

Specific details of several embodiments of battery internal resistance estimation, and associated systems and methods, are described Above. A person skilled in the relevant art will recognize that suitable stages of the methods described herein can be performed at the battery level or at the system level. The description of the present disclosure has been presented for purposes of illustration and description but is not intended to be exhaustive or limited to the disclosure in the form disclosed. Many modifications and variations will be apparent to those of ordinary skill in the art without departing from the scope and spirit of the disclosure. The embodiment was chosen and described in order to best explain the principles of the disclosure and the practical application, and to enable others of ordinary skill in the art to understand the disclosure for various embodiments with various modifications as are suited to the particular use contemplated.

The functions described herein may be implemented in hardware, software executed by a processor, firmware, or any combination thereof. Other examples and implementations are within the scope of the disclosure and appended claims. Features implementing functions may also be physically located at various positions, including being distributed such that portions of functions are implemented at different physical locations.

As used herein, including in the claims, "or" as used in a list of items (for example, a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

It should be emphasized that many variations and modifications can be made to the above-described examples, the elements of which are to be understood as being among other acceptable examples. All such modifications and variations are intended to be included herein within the scope of this disclosure and protected by the following claims. Various other aspects, features, and advantages of the disclosure will be apparent through the detailed description of the disclosure and the drawings attached hereto. It is also to be understood that both the foregoing general description and the following detailed description are examples and are not restrictive of the scope of the disclosure. As used in the specification and in the claims, the singular forms of "a," "an," and "the" include plural referents unless the context clearly dictates otherwise. In addition, as used in the specification and the claims, the term "or" means "and/or" unless the context clearly dictates otherwise. Additionally, as used in the specification, "a portion" refers to a part of, or the entirety of (i.e., the entire portion), a given item (e.g., data) unless the context clearly dictates otherwise.

We claim:

1. A method of measuring battery internal resistance during a charging process of a battery, the method comprising:

applying a charge current to the battery through modulating a charge current limit;

monitoring battery operation conditions comprising a state of charge (SOC) of the battery and a temperature of the battery;

applying a first current pulse by adjusting the charge current limit of the battery based on at least one of the battery operation conditions meeting one or more pre-defined threshold values;

measuring voltages of the battery during a first and a second time window of the first current pulse; and estimating the battery internal resistance in accordance with variances of the voltages of the battery and variances of the charge current.

2. The method of claim 1 wherein the one or more pre-defined threshold values comprise a SOC of the battery ranging from 50% to 80% and a battery temperature ranging from 10° C. to 40° C.

3. The method of claim 1 wherein the applied charge current is equal to or lower than the charge current limit.

4. The method of claim 1 wherein the applied charge current is constant, and wherein the first current pulse is a negative current pulse having a lower current amplitude to the charge current.

5. The method of claim 4 wherein a current amplitude of the negative first current pulse is ranging between 10% to 90% of the charge current.

6. The method of claim 4 wherein measuring of the voltages of the battery during the first and the second time window of the first current pulse comprises measuring variances of the voltages of the battery corresponding to a falling edge of the first current pulse and measuring variances of the voltages of the battery corresponding to a width of the first current pulse.

7. The method of claim 4, further comprising applying one or more additional current pulses after the first current pulse.

8. The method of claim 7 wherein the one or more additional current pulses comprise a current amplitude ranging from 10% to 90% of a corresponding previous current pulse.

9. The method of claim 1 wherein a period of the second time window ranges from 10 seconds to 600 seconds.

10. The method of claim 1 wherein estimating the battery internal resistance comprises estimating an ohmic impedance $R_0$ and a charge transfer and concentration difference impedance $R_{RC}$.

11. The method of claim 1 wherein measuring the voltages of the battery during the first and the second time window of the first current pulse includes measuring variances of the voltages of the battery corresponding to a raising edge of the first current pulse and measuring variances of the voltages of the battery corresponding to a width of the first current pulse.

12. The method of claim 11 further comprises, before applying the first current pulse:

reducing the charge current limit by 10% to 90%.

13. The method of claim 12 wherein the reducing the charge current limit lasts for 100 second to 1200 seconds.

14. The method of claim 1, further comprising validating the battery resistance estimation using a model-in-the-loop (MiL) simulation and a second-order equivalent circuit model (ECM).

15. The method of claim 14 wherein the MiL simulation includes measuring an open-circuit voltage of the battery that is dependent on the SOC and the temperature of the battery.

16. The method of claim 1 wherein the charge current and the first current pulse are direct current (DC) currents.

17. The method of claim 1 wherein the first current pulse is applied on a battery cell and a battery cell internal resistance is estimated by measuring voltage variances of the battery cell and variances of the charge current.

18. A method of measuring an electrical device resistance, the method comprising:

charging an electrical device by applying a constant charge current and measuring a voltage of the electrical device, the constant charge current being equal to lower than a current limit;

monitoring, while charging the electrical device, electrical device conditions;

applying a current pulse by adjusting current limit based on at least one of electrical device operation conditions meeting one or more pre-defined threshold values;

measuring voltages of the electrical device during a time window of the current pulse; and estimating the electrical device resistance in accordance with variances of the voltages of the electrical device and variances of the charge current.

19. A battery management system, comprising:

one or more local electronic control units (LECUs), each of the one or more LECUs includes a temperature sensor, a current monitor, and a voltage monitor;

a battery management unit connected to and electrically communicate with the one or more LECUs, the battery management unit including a state of charge (SOC) monitor and connecting to a memory device storing charge current and voltage information forwarded from the one or more LECUs and pre-defined threshold values of battery operation conditions, wherein the battery operation conditions comprises a SOC of the battery and a temperature of the battery;

a battery resistance estimator connected to the battery management unit, the battery resistance estimator being configured to estimate a battery internal resistance in accordance with variances of voltage and variances of charge current of the battery;

a current source connected to the one or more LECUs, the current source is configured to provide a constant charge current to the one or more LECUs for battery charging, wherein the current source is configured to apply a current pulse to the constant charge current based on the battery operation conditions meeting one or more pre-defined threshold levels.

20. The battery management system of claim 19 wherein the pre-defined threshold values of battery operation conditions comprise a SOC of the battery ranging from 50% to 80% and a battery temperature ranging from 10° C. to 40° C.

* * * * *